United States Patent
Baumgartner et al.

(10) Patent No.: US 7,624,363 B2
(45) Date of Patent: Nov. 24, 2009

(54) METHOD AND APPARATUS FOR PERFORMING EQUIVALENCE CHECKING ON CIRCUIT DESIGNS HAVING DIFFERING CLOCKING AND LATCHING SCHEMES

(75) Inventors: Jason R. Baumgartner, Austin, TX (US); Tobias Gemmeke, Boeblingen (DE); Nicolas Maeding, Holzgerlingen (DE); Kai O. Weber, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 11/679,234

(22) Filed: Feb. 27, 2007

(65) Prior Publication Data

US 2008/0209287 A1 Aug. 28, 2008

(51) Int. Cl.
*G06F 17/50* (2006.01)
(52) U.S. Cl. .......................................................... 716/5
(58) Field of Classification Search ............. 716/5
See application file for complete search history.

(56) References Cited

U.S. PATENT DOCUMENTS

| | | | | |
|---|---|---|---|---|
| 6,799,308 B2 * | 9/2004 | You et al. | ...................... | 716/6 |
| 6,874,134 B1 * | 3/2005 | Collin et al. | ................... | 716/3 |

* cited by examiner

*Primary Examiner*—Jack Chiang
*Assistant Examiner*—Brandon W Bowers
(74) *Attorney, Agent, or Firm*—Dillon & Yudell LLP

(57) ABSTRACT

A method for performing equivalence checking on logic circuit designs is disclosed. Within a composite netlist of an original version and a modified version of a logic circuit design, all level-sensitive sequential elements sensitized by a clock=0 are converted into buffers, and all level-sensitive sequential elements sensitized by a clock=1 are converted into level-sensitive registers. A subset of edge-sensitive sequential elements are selectively transformed into level-sensitive sequential elements by removing edge detection logic from the subset of the edge-sensitive sequential elements. A clock to the resulting sequential elements is then set to a logical "1" to verify the sequential equivalence of the transformed netlist.

5 Claims, 3 Drawing Sheets

METHOD AND APPARATUS FOR PERFORMING EQUIVALENCE CHECKING ON CIRCUIT DESIGNS HAVING DIFFERING CLOCKING AND LATCHING SCHEMES

BACKGROUND OF THE INVENTION

1. Technical Field

The present invention relates to integrated circuit verification tools in general, and more particularly, to a method and apparatus for performing equivalence checking on logic circuits. Still more particularly, the present invention relates to a method and apparatus for performing equivalence checking on logic circuit designs having differing clocking and latching schemes.

2. Description of Related Art

During the design stage of integrated circuits, equivalence checking is commonly performed in order to find circuit equivalence between two logic circuit designs. There are many circumstances under which sequential input/output (I/O) equivalence checking on two logic circuit designs having differing clocking and latching schemes are desirable. For example, after a logic circuit design has been remapped to a newer circuit technology, it is very common that the clocking and latching libraries of the newer circuit also need to be changed, especially when the remapping is non-trivial. Also, because the remapping may occur across different hardware description languages, such as changing from Verilog to very-high level description language (VHDL) or vice-versa, it is beneficial to use a sequential equivalence checking tool to ensure that the remapping does not alter the I/O behavior of the logic circuit design.

However, logic circuit remapping tends to pose several challenges to sequential equivalence checking. For example, after remapping had been performed on one of the logic circuit designs, the two logic circuit designs may not be I/O equivalent anymore due to many reasons. One reason being an output transition of a logic circuit design using master-slave pairs can come half a clock period earlier or later than its equivalent circuit design using edge-sensitive registers. Nevertheless, such a difference is not of interest when verifying equivalence because it does not affect the overall design behavior, and the difference is merely an artifact of the chosen clocking and latching scheme and the chosen hierarchy points at which the equivalence check is performed.

Although the above-mentioned problem can be rectified by manually adding a "wrapper" layer of latches to the "faster" logic circuit design to normalize out any mismatches, such a solution has a computational overhead in addition to the practical unattractiveness of manually editing the logic circuit design only for the purpose of equivalence checking. In addition, on a more serious level, the different clocking and latching schemes may destroy a great deal of "signal equivalences" within the two logic circuit designs for the same reason, i.e., internal master-slave pairs update slightly earlier or later than internal registers, causing all gates in the combinational fanout of such elements to mismatch functionally. Since most sequential equivalence checking algorithms rely upon a significant amount of internal gate equivalences for speed and scalability, thus, such characteristic adds an enormous computational overhead to the sequential equivalence checking process. Consequently, it would be desirable to provide all improved method and apparatus for performing equivalence checking on logic circuit designs having differing clocking and latching schemes.

SUMMARY OF THE INVENTION

In accordance with a preferred embodiment of the present invention, a composite netlist is initially built for an original version and a modified version of a logic circuit design. Within the composite netlist, all level-sensitive sequential elements sensitized by a clock=0 are converted into buffers, and all level-sensitive sequential elements sensitized by a clock=1 are converted into level-sensitive registers. A subset of edge-sensitive sequential elements is selectively transformed into level-sensitive sequential elements by removing edge detection logic from the subset of the edge-sensitive sequential elements. A clock to the resulting sequential elements is set to a logical "1" to verify the sequential equivalence of the transformed netlist.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
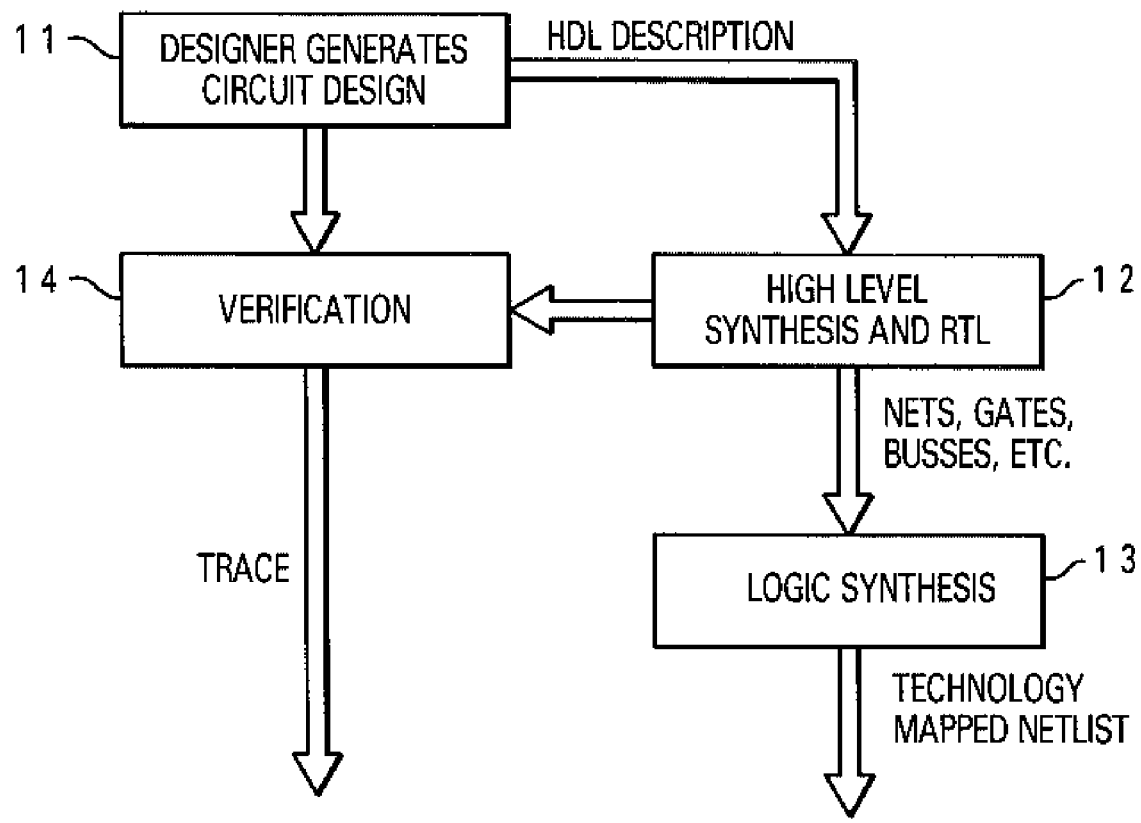
FIG. 1 is a high-level logic flow diagram of a process for generating and verifying a hardware circuit design, in accordance with a preferred embodiment of the present invention.

Referring now to the drawings, and specifically to FIG. 1, there is depicted a high-level logic flow diagram of a process for generating and verifying a hardware circuit design, in accordance with a preferred embodiment of the present invention. As shown, the process starts with a hardware description of a logic circuit design generated by a circuit designer, as shown in block 11. Such hardware description may be written in a hardware description language (HDL). High-level synthesis and register-transfer-level (RTL) synthesis are then performed on the hardware description to generate a description of a network of gates, buses, adders, registers, etc. corresponding to the hardware description in a particular format, as depicted in block 12. Logic synthesis optimizes the network description and produces a technology mapped netlist of the logic circuit design that can be used for circuit fabrication, as shown in block 13.

Verification is the process of verifying the operation of the logic circuit model. Verification may be performed on either the network description or the hardware description of the logic circuit design, as depicted in block 14. Verification may produce a trace illustrating the operation of the logic circuit design. The trace may be manually or automatically parsed in order to assess whether the logic circuit behaved properly or improperly along that trace. Phase abstraction is then applied to the logic circuit design to reduce the workload when performing the verification.

Generally speaking, a logic circuit design may include multiple sequential elements such as latches and registers. A level-sensitive latch is a gate having two inputs (such as a data-in and a clock) and one data-out output. When the clock is at a logical 1, the data-out value is identical to the data-in value (i.e., the latch acts as a buffer). Otherwise, the last-driven data-out value is held (which may be the initial value of the latch if its clock was never a logical 1). A standard register also has two inputs (such as a data-in and a clock) and one data-out output. When the clock is at a logical 1, the register samples its data-in value to drive to its data-out value one time-step later. Otherwise, the register holds its last-driven data-out value. An edge-sensitive register, which is a variant of the standard register, samples only when its clock transitions from a logical 0 to a logical 1. In addition, logic circuit designs often include a primary input clock that is distributed to the input pins of the latches and registers, possibly through local clock buffers.

Figure 2:
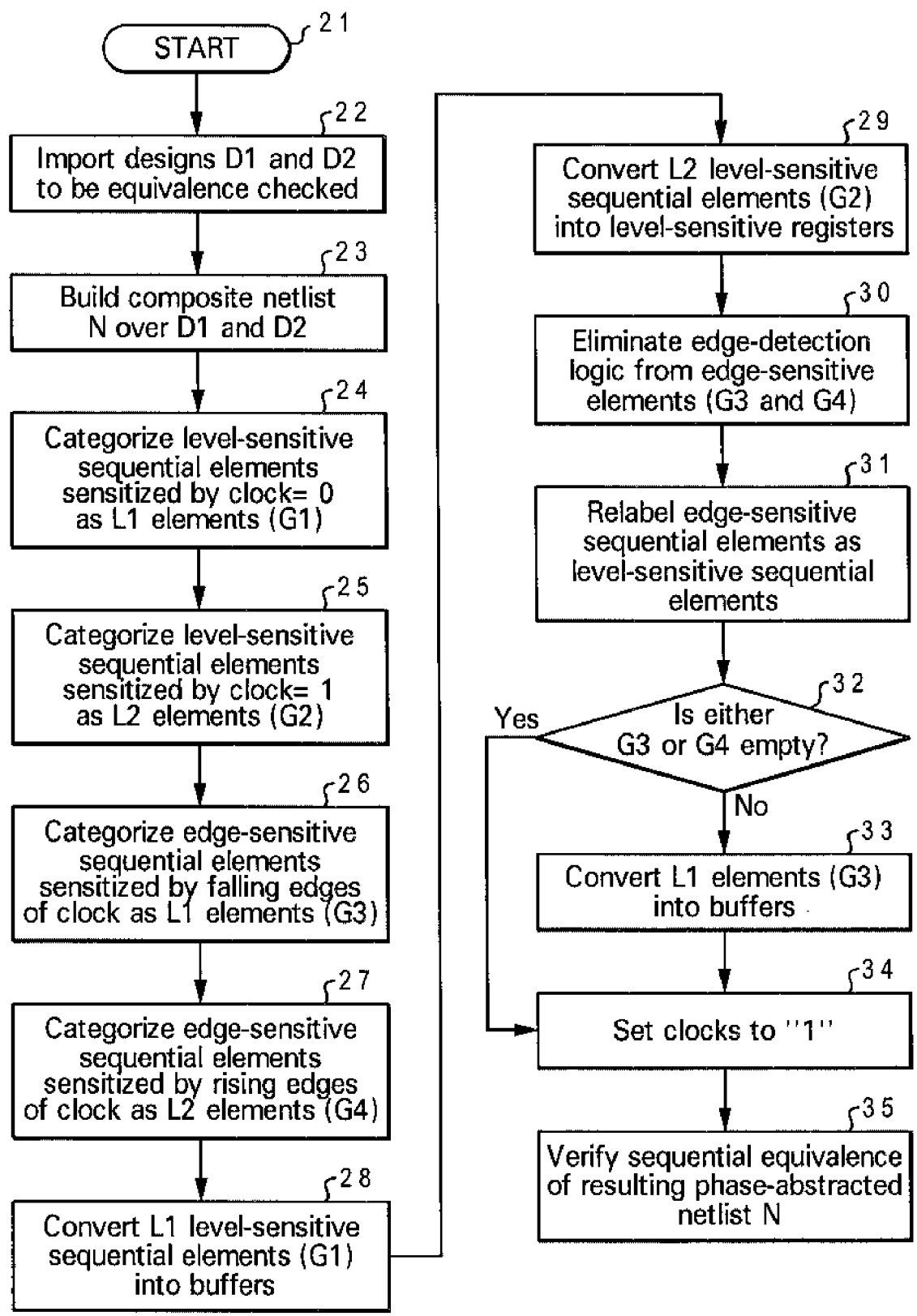
FIG. 2 is a high-level logic flow diagram of a method for performing equivalence checking on logic circuit designs having differing clocking and latching schemes, in accordance with a preferred embodiment of the present invention.

With reference now to FIG. 2, there is depicted a high-level logic flow diagram of a method for performing equivalence checking on logic circuit designs having differing clocking and latching schemes, in accordance with a preferred embodiment of the present invention. Starting at block 21, an original version and a modified version of a logic circuit design are imported, as shown in block 22. The original version of the logic circuit design can be named, for example, design D1, and the modified version of the logic circuit design can be named, for example, design D2. A composite netlist N is then built for both designs D1 and D2, as depicted in block 23.

Within the netlist N, the level-sensitive sequential elements (such as level-sensitive latches) that are sensitized by a clock=0 are categorized as L1 elements, as shown in block 24, and this group is labelled as G1. The level-sensitive sequential elements that are sensitized by a clock=1 are categorized as L2 elements, as depicted in block 25, and this group is labelled as G2.

The edge-sensitive sequential elements (such as edge-sensitive registers) that are sensitized by falling edges of a clock are categorized as L1 elements, as shown in block 26, and this group is labelled as G3. The edge-sensitive sequential elements that are sensitized by rising edges of a clock are categorized as L2 elements, as depicted in block 27, and this group is labelled as G4.

Within group G1, the L1 elements (i.e., L1 latches) are converted into buffers, as shown in block 28. Within group G2, the L2 elements (i.e., L2 latches) are converted into level-sensitive registers, as depicted in block 29.

Subsequently, a determination is made as to whether or not either group G3 or group G4 is empty, as shown in block 30. If neither group G3 nor group G4 is empty, then the L1 elements in group G3 are converted into buffers, as depicted in block 31. Otherwise, if either group G3 or group G4 is empty, then the edge detection logic are eliminated from either the L1 elements in group G3 or the L2 elements in group G4, as shown in block 32. The edge-sensitive sequential elements in either group G3 or group G4 are re-labeled as level-sensitive sequential elements, as depicted in block 33.

Next, the clocks to all the sequential elements are set to a logical "1," as shown in block 34. Finally, the sequential equivalence of resultant phase-abstracted netlist N is verified, as depicted in block 35. The sequential equivalent can be performed by using a sequential equivalent checking program that is well-known to those skilled in the art.

As has been described, the present invention provides an improved method and apparatus for performing equivalence checking on logic circuit designs having differing clocking and latching schemes. The present invention uses an automated clocking and latching abstraction technique to "normalize out" the differences in logic circuit designs that include differing clocking and latching schemes. This enables a greater degree of equivalence between internal signals of the two logic circuit designs, and prevents the need of using "wrapper" latches to normalize out half-clock period mismatches. In addition, the present invention simplifies the overall equivalence checking process by reducing the number of state elements within in the logic circuit designs. This results in a dramatic decrease in computational resources needed for performing equivalence checking, and the need for post-processing to normalize out clock-phase mismatches is eliminated.

The method of the present invention may be implemented by a computer system executing a sequence of program instructions for carrying out the steps of the method and may be embodied in a computer usage media capable of storing program instructions. The present invention applies equally regardless of the particular type of signal bearing media utilized to actually carry out the distribution. Examples of signal bearing media include, without limitation, recordable type media such as floppy disks or compact discs and transmission type media such as analog or digital communications links.

Figure 3:
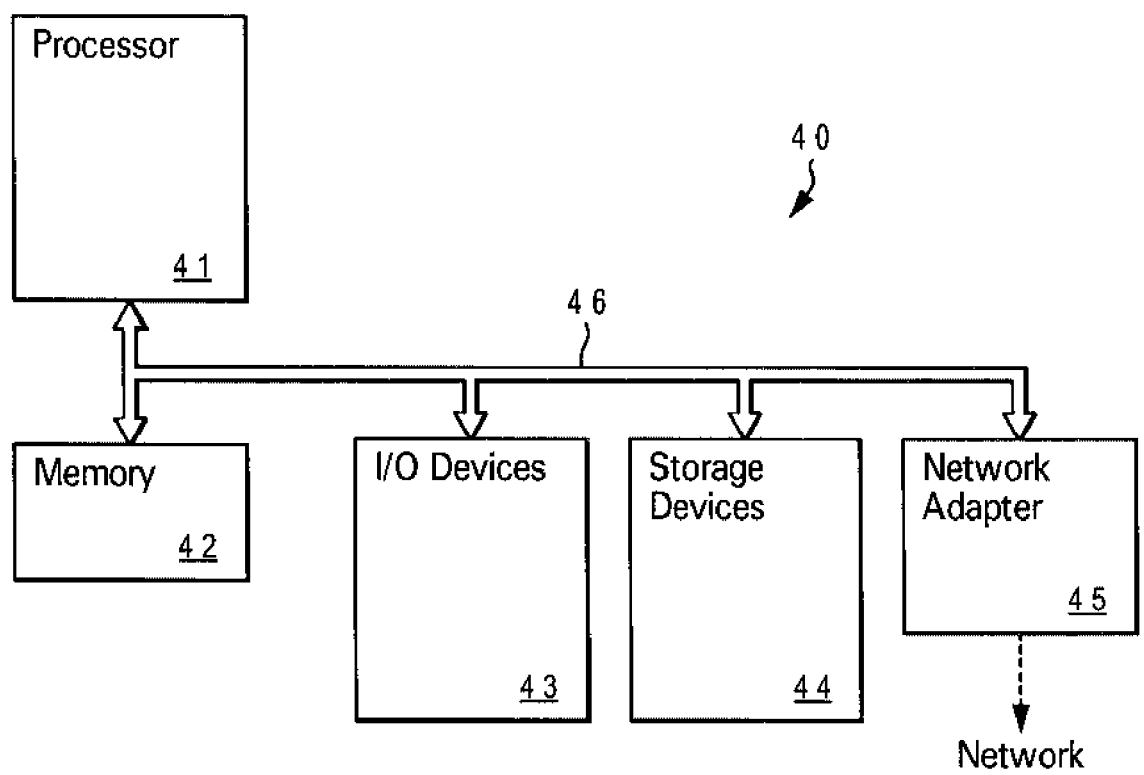
FIG. 3 is a block diagram of a computer system in which a preferred embodiment of the present invention can be incorporated.

Referring now to FIG. 3, there is depicted a block diagram of a computer system in which a preferred embodiment of the present invention can be incorporated. As shown, a computer system 40 includes a processor 41 coupled to a memory 42 via a bus 46. Processor 41 executes sequences of program instructions resided in memory 42. The program instructions resided in memory 42 are preferably loaded from storage devices 44, such as hard disks, that are also coupled to bus 46. The program instructions may also be loaded from a network via network adapter 45. Also coupled to bus 46 are I/O devices 43, such as video displays, printers, keyboards, mice and scanners, for providing user inputs and outputs.

While the invention has been particularly shown and described with reference to a preferred embodiment, it will be understood by those skilled in the art that various changes in form and detail maybe made therein without departing from the spirit and scope of the invention.

What is claimed is:

1. A computer system for performing equivalence checking on logic circuit designs having differing clocking and latching schemes, said computer system comprising:

for an original and modified versions of an integrated logic circuit design,
  means for converting level-sensitive sequential elements sensitized by a clock=0 into buffers;
  means for converting level-sensitive sequential elements sensitized by a clock=1 into level-sensitive registers;
  means for selectively transforming a subset of edge-sensitive sequential elements to level-sensitive sequential elements by removing edge detection logic from said subset of edge-sensitive sequential elements; and
means for setting a clock to said sequential elements to a logical "1" to verify sequential equivalences of said original and modified versions of said integrated logic circuit design; and
means for generating by said computer system an indication of sequential equivalence of said original and modified versions of said integrated logic circuit design.

2. The computer system of claim 1, wherein said computer system further includes
- means for categorizing all level-sensitive sequential elements sensitized by a clock=0 as L1 elements in a group G1;
- means for categorizing all level-sensitive sequential elements sensitized by a clock=1 as L2 elements in a group G2;
- means for categorizing all edge-sensitive sequential elements sensitized by falling edges of a clock as L1 elements in a group G3; and
- means for categorizing all edge-sensitive sequential elements sensitized by rising edges of a clock as L2 elements in a group G4.

3. The computer system of claim 2, wherein said means for converting level-sensitive sequential elements sensitized by a clock=0 further includes means for converting said L1 elements within said group G1 into buffers.

4. The computer system of claim 3, wherein said means for converting level-sensitive sequential elements sensitized by a clock=1 further includes means for converting said L2 elements within said group G2 into level-sensitive registers.

5. The computer system of claim 2, wherein said means for selectively transforming further includes
- means for determining whether or not either said group G3 or said group G4 is empty;
- means for, in response to a determination that neither group G3 nor group G4 is empty, converting L1 elements in said group G3 into buffers; and
- means for, in response to a determination that either said group G3 or said group G4 is empty, removing edge detection logic from said L1 or L2 elements within said groups G3 or G4, and re-labeling edge-sensitive sequential elements within said groups G3 or G4 as level-sensitive sequential elements.

* * * * *